United States Patent [19]

Dickson et al.

[11] Patent Number: 4,892,592

[45] Date of Patent: Jan. 9, 1990

[54] THIN FILM SEMICONDUCTOR SOLAR CELL ARRAY AND METHOD OF MAKING

[75] Inventors: Charles R. Dickson, Trenton; Barry J. Johnson, Cream Ridge, both of N.J.; David B. Gerhardt, Solebury, Pa.

[73] Assignee: Solarex Corporation, Rockville, Md.

[21] Appl. No.: 270,443

[22] Filed: Nov. 8, 1988

Related U.S. Application Data

[63] Continuation of Ser. No. 31,919, Mar. 26, 1987, abandoned.

[51] Int. Cl.[4] ....................... H01L 27/14; H01L 31/18

[52] U.S. Cl. ........................................ 136/244; 437/2; 437/4

[58] Field of Search ....................... 219/121.68, 121.69, 219/121.80; 437/2, 4; 136/244

[56] References Cited

U.S. PATENT DOCUMENTS

| | | | |
|---|---|---|---|
| 4,081,653 | 3/1978 | Koo et al. | 219/121.68 |
| 4,517,403 | 5/1985 | Morel et al. | 136/249 |
| 4,532,371 | 7/1985 | Hanak et al. | 136/249 |
| 4,638,111 | 1/1987 | Gay | 136/249 |
| 4,650,524 | 3/1987 | Kiyama et al. | 437/193 |
| 4,667,058 | 3/1987 | Catalano et al. | 136/244 |
| 4,675,467 | 6/1987 | Van Dine et al. | 136/249 |
| 4,705,698 | 11/1987 | Van Dine | 427/53.1 |
| 4,724,011 | 2/1988 | Turner et al. | 136/249 |

*Primary Examiner*—Aaron Weisstuch

*Attorney, Agent, or Firm*—Finnegan, Henderson, Farabow, Garrett & Dunner

[57] ABSTRACT

A method of forming laser-patterned conductive elements on a thin film of semiconductor material in a semiconductor device by fabricating a thin film of metal on the semiconductor material and scribing the semiconductor film along a desired pattern with a laser operated at a power density sufficient to ablate the semiconductor material along the desired pattern. The ablation of the semiconductor material produces gases that structurally weaken and burst through the metal film along the desired pattern to form gaps separating the metal film into a plurality of conductive elements, for example, back electrodes on a thin-film photovoltaic module. In a second embodiment, a method of forming a multi-cell thin-film semiconductor device with laser-patterned back electrodes includes the steps of fabricating a plurality of spaced-apart front electrodes on a substrate, fabricating a thin film of semiconductor material on the front electrodes, fabricating a thin film of metal on the semiconductor film, and scribing the metal film along a pattern of lines with a laser operated at a power density sufficient to melt the metal through the underlying semiconductor film and form electrical connections between the metal film and the front electrodes along the scribe lines. Multi-cell, thin-film amorphous silicon photovoltaic modules having back electrodes formed by the above methods also are disclosed.

10 Claims, 4 Drawing Sheets

THIN FILM SEMICONDUCTOR SOLAR CELL ARRAY AND METHOD OF MAKING

This application is a continuation of application Ser. No. 031,919, filed Mar. 26, 1987, now abandoned.

BACKGROUND OF THE INVENTION

1. Field of the Invention

The present invention relates to a method of forming conductive elements on thin-film semiconductor devices. "Thin-film" semiconductor devices generally are understood to comprise layers of material each less than 10 micrometers (100,000 Å) thick successively fabricated on a flat substrate. More particularly, the present invention relates to a method of forming back electrodes on photovoltaic cells comprised of thin films of amorphous silicon.

2. Description of the Related Art

As is well known in the thin-film semiconductor art, photovoltaic cells that convert solar radiation into usable electrical energy can be fabricated by sandwiching certain semiconductor structures, such as, for example, the amorphous silicon PIN structure disclosed in U.S. Pat. No. 4,064,521, between two electrodes. One of the electrodes typically is transparent to permit solar radiation to reach the semiconductor material. This "front" electrode can be comprised of a thin film (i.e., less than 10 micrometers in thickness) of transparent conductive oxide material, such as tin oxide, and usually is formed between a transparent supporting substrate made of glass or plastic and the photovoltaic semiconductor material. The "back" electrode, which is formed on the surface of the semiconductor material opposite the front electrode, generally comprises a thin film of metal such as, for example, aluminum.

The voltage produced across the electrodes of a single photovoltaic cell, however, is insufficient for most applications. To achieve a useful power level from photovoltaic semiconductor devices, individual photovoltaic cells must be electrically connected in series in an array referred to herein as photovoltaic "module." A typical arrangement of series-connected photovoltaic cells is shown in FIG. 1.

FIG. 1 shows photovoltaic module 10 comprised of a plurality of series-connected photovoltaic cells 12 formed on a transparent substrate 14 and subjected to solar radiation 16 passing through substrate 14. Each photovoltaic cell 12 includes a front electrode 18 of transparent conductive oxide, a photovoltaic element 20 made of a semiconductor material, such as, for example, hydrogenated amorphous silicon, and a back electrode 22 of a metal such as aluminum. Photovoltaic element 20 can compromise, for example, a PIN structure. Adjacent front electrodes 18 are separated by first grooves 24, which are filled with the semiconductor material of photovoltaic elements 20. The dielectric semiconductor material in first grooves 24 electrically insulates adjacent front electrodes 18. Adjacent photovoltaic elements 20 are separated by second grooves 26, which are filled with the metal of back electrodes 22 to provide a series connection between the front electrode of one cell and the back electrode of an adjacent cell. Adjacent back electrodes 22 are electrically isolated from one another by third grooves 28.

The thin-film photovoltaic module of FIG. 1 typically is manufactured by a deposition and patterning method. One example of a suitable technique for depositing a semiconductor material on a substrate is glow discharge in silane, as described, for example, in U.S. Pat. No. 4,064,521. Several patterning techniques are conventionally known for forming the grooves separating adjacent photovoltaic cells, including silkscreening with resist masks, etching with positive or negative photoresists, mechanical scribing, electrical discharge scribing, and laser scribing. Laser scribing and silkscreening methods have emerged as practical, cost-effective, high-volume processes for manufacturing thin-film semiconductor devices, including amorphous silicon photovoltaic modules. Laser scribing has an additional advantage over silkscreening because it can separate adjacent cells in a multi-cell device by forming separation grooves having a width less than 25 micrometers, compared to the typical silkscreened groove width of approximately 380–500 micrometers. A photovoltaic module fabricated with laser scribing thus has a larger percentage of its surface area actively engaged in producing electricity and, consequently, has a higher efficiency than a module fabricated by silkscreening. A method of laser scribing the layers of a photovoltaic module is disclosed in U.S. Pat. No. 4,292,092.

Referring to FIG. 1, a method of fabricating a multicell photovoltaic module using laser scribing comprises: depositing a continuous film of transparent conductive oxide on a transparent substrate 14, scribing first grooves 24 to separate the transparent conductive oxide film into front electrodes 18, fabricating a continuous film of photovoltaic semiconductor material on top of front electrodes 18 and in first grooves 24, scribing second grooves 26 parallel and adjacent to first grooves 24 to separate the semiconductor material into individual photovoltaic elements 20 and expose portions of front electrodes 18 at the bottoms of the second grooves, forming a continuous film of metal on elements 20 and in second grooves 26 so that the metal forms electrical connections with front electrodes 18, and then scribing third grooves 28 parallel and adjacent to second grooves 26 to separate and electrically isolate adjacent back electrodes 22.

Complete reliance on laser scribing to pattern photovoltaic modules in the manner described above, however, heretofore has not been practical. The reflectivity of the metal forming back electrodes 22 requires use of relatively high laser power densities during scribing of third grooves 28, which has been found to damage the underlying semiconductor material of photovoltaic elements 20. When the photovoltaic elements are comprised of amorphous silicon, the damage resulting from laser scribing the overlying metal includes recrystallization of the amorphous silicon. Such recrystallization tends to create electrical connections between adjacent back electrodes, which produces short circuits between paired front and back electrodes and substantially reduces the efficiency of the photovoltaic module. Shorting also can result from the laser causing the back electrode metal to diffuse into the underlying semiconductor material to form conductive alloys. Consequently, in prior art patterning methods, silkscreening with acid etching must generally be used to form the grooves separating the back electrodes and to produce an operable photovoltaic module.

The present invention is intended to provide a method of laser patterning the metal film forming the back electrodes on thin-film semiconductor devices, including amorphous silicon photovoltaic devices, without damaging the semiconductor material underlying the metal film. Such a method would provide distinct advantages over conventional silkscreen patterning methods.

For instance, a photovoltaic module having laser-patterned back electrodes can be provided with a larger active area by taking advantage of the ability to form narrower grooves in thin-film devices by laser scribing than by acid etching with silkscreened etch resists.

In addition, patterning back electrodes by silkscreening requires additional processing steps that significantly decrease production throughput and increase labor costs relative to a laser patterning process. For example, etching third grooves 28 to separate back electrodes 22 of photovoltaic module 10 requires the steps of (1) forming a silkscreened pattern of acid-resistant material over the metal film to cover the back electrodes and expose the desired dividing lines between the back electrodes, (2) etching the exposed portions of the metal with acid to form third grooves 28, (3) rinsing the photovoltaic module to remove the acid, (4) applying a solvent to remove the silkscreened pattern, (5) rinsing the photovoltaic module to remove the solvent, and (6) drying the photovoltaic module.

Furthermore, a practical method of laser patterning back electrodes on a thin-film photovoltaic module without damaging the semiconductor film, when combined with conventional methods of laser scribing the conductive oxide film and photovoltaic semiconductor film, eliminates any need for silkscreen processing equipment and personnel in the manufacture of thin-film photovoltaic modules.

The present invention also is intended to provide an improved method of forming the electrical interconnections between the front and back electrodes of a photovoltaic module separated by a thin film of semiconductor material. In prior art methods, the interconnections are formed by scribing grooves in the semiconductor material to expose portions of the front electrodes at the bottoms of the grooves and then fabricating a metal film over the scribed semiconductor film and in the grooves. Thus, the module must be transferred from a semiconductor film deposition station to a laser scribing station and then to a metal film deposition station. One embodiment of the present invention is intended to provide a method of forming the interconnections between front and back electrodes that eliminates the laser scribing step conventionally performed between deposition of the semiconductor film and metal film and creates the interconnections at the same time as the grooves separating the back electrodes are formed. By forming the interconnections simultaneously with the grooves separating the back electrodes, further increases in production efficiency are obtainable.

Additional advantages of the present invention will be set forth in part in the description that follows and in part will be obvious from that description or can be learned from practice of the invention. The advantages of the invention can be realized and obtained by the method particularly pointed out in the appended claims.

SUMMARY OF THE INVENTION

The present invention overcomes the problems of the prior art methods of patterning back electrodes on thin-film semiconductor devices by patterning the semiconductor material underlying the metal film with a laser operated at a power density sufficient to ablate the semiconductor material and produce gases that structurally weaken and burst through the portions of the metal film overlying the ablated semiconductor material, thus separating the metal film into a plurality of back electrodes. Simultaneously with the laser ablation of the semiconductor film, the metal film can be laser scribed to melt through the underlying semiconductor material and form the series connections with the front electrodes.

To overcome the problems of the prior art methods and in accordance with the purpose of the invention, as embodied and broadly described herein, the method of this invention of laser patterning a thin film of metal fabricated on a thin film of semiconductor material comprises the step of scribing the semiconductor film along a desired pattern with a laser operated at a power density sufficient to ablate the semiconductor material along the pattern, the ablation of the semiconductor material producing gases that structurally weaken and burst through the metal film along the pattern.

Broadly, this invention further includes a method of forming laser-patterned conductive elements on a thin film of semiconductor material in a semiconductor device comprising the steps of fabricating a thin film of metal on the semiconductor film and scribing the semiconductor material film along a desired pattern with a laser operated at a power density sufficient to ablate the semiconductor material along the pattern. The ablation of the semiconductor material produces gases that structurally weaken and burst through the metal film along the pattern to form gaps separating the metal film into a plurality of conductive elements. Preferably, ultrasonic vibration is applied to the semiconductor device to remove any metal debris from the gaps.

In a second embodiment, this invention includes a method of forming a multi-cell thin-film semiconductor device with laser-patterned back electrodes comprising the steps of fabricating a plurality of spaced-apart front electrodes on a substrate, fabricating a thin film of semiconductor material on the front electrodes, and fabricating a thin film of metal on the semiconductor film. The metal film is scribed along a pattern of first lines with a laser operated at a power density sufficient to melt the metal through the underlying semiconductor film to form electrical connections between the metal film and the front electrodes along the first lines. In addition and preferably simultaneously with the line scribing step, the semiconductor film underlying the metal film is scribed along a pattern of second lines with a laser operated at a power density sufficient to ablate the semiconductor material along the second lines. The ablation of the semiconductor material produces gases that structurally weaken and burst through the metal film overlying the semiconductor material along the second lines to form gaps separating the metal film into a plurality of back electrodes.

The accompanying drawings, which are incorporated in and which constitute a part of the specification, illustrate at least one embodiment of the invention and, together with the description, explain the principles of the invention.

DESCRIPTION OF THE PREFERRED EMBODIMENTS

Figure 1:
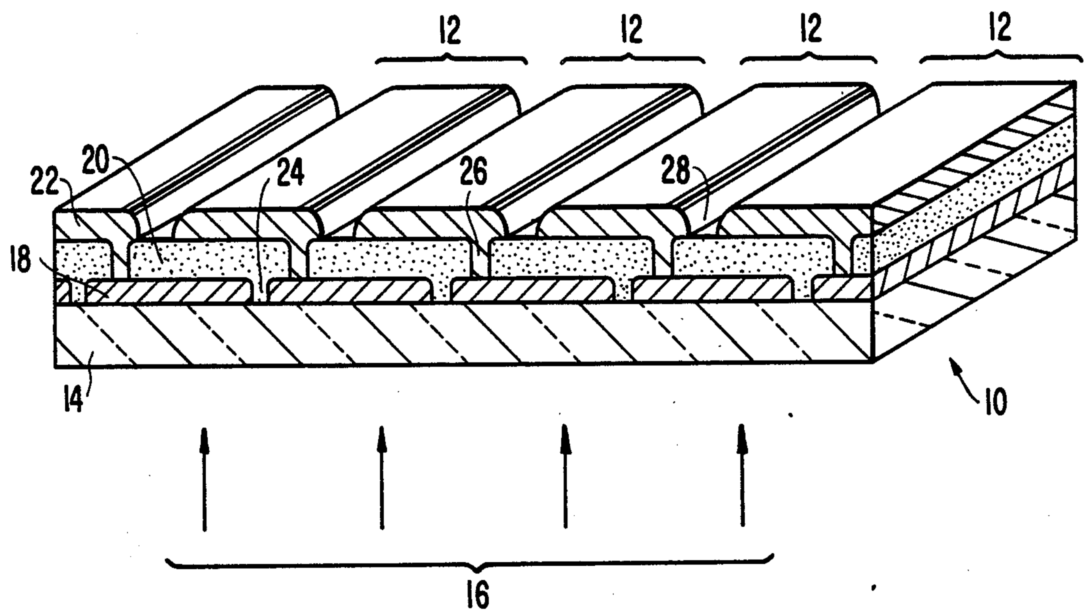
FIG. 1 is a schematic perspective view of a prior art photovoltaic module fabricated according to a prior art method.
Figure 2A:
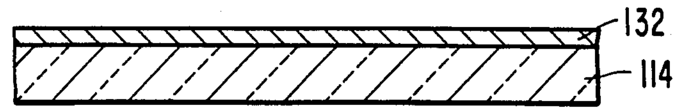
FIGS. 2(*a*) through 2(*g*) are schematic cross sectional views depicting the steps of one embodiment of the method of this invention for fabricating a photovoltaic module having laser-patterned back electrodes.
Figure 2B:
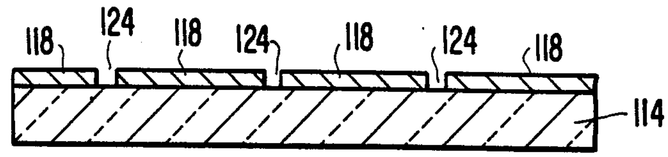
Figure 2C:
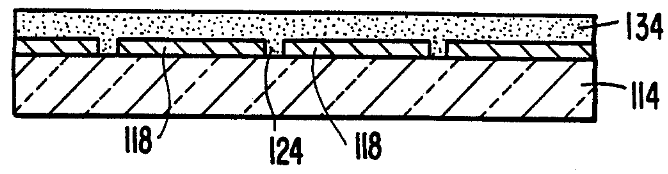
Figure 2D:
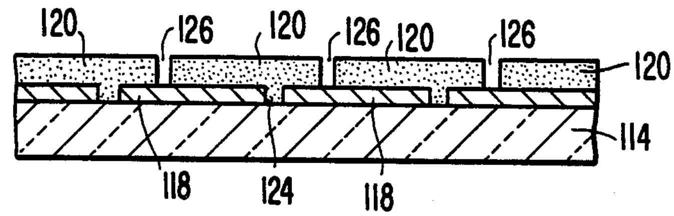
Figure 2E:
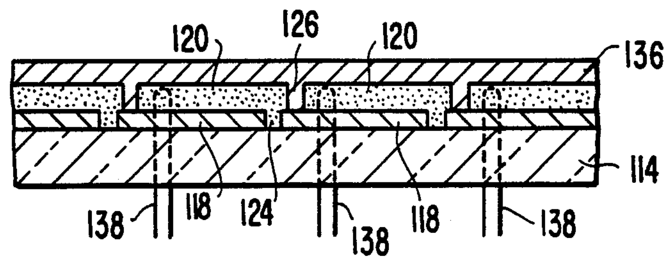
Figure 2F:
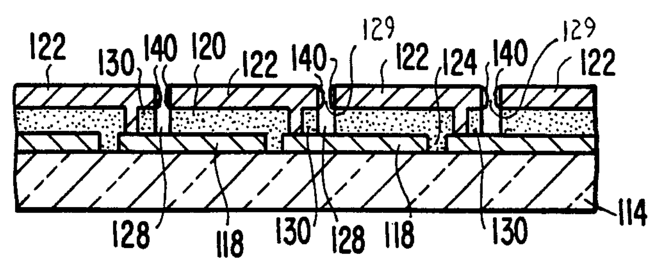
Figure 2G:
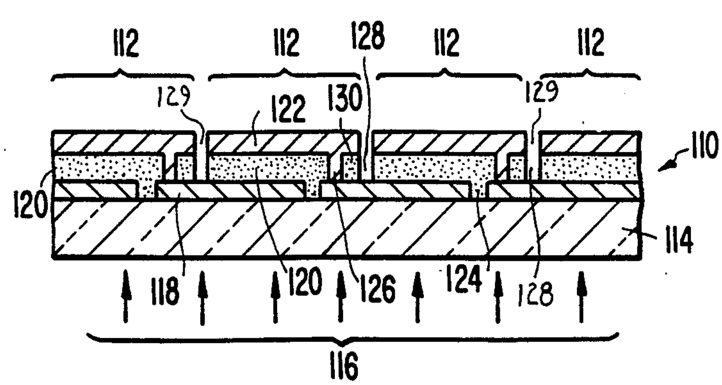
Figure 3A:
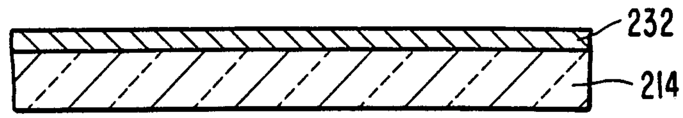
FIGS. 3(*a*) through 3(*f*) are schematic cross sectional views depicting the steps of a second embodiment of the method of this invention for fabricating a photovoltaic module having laser-patterned back electrodes.
Figure 3B:
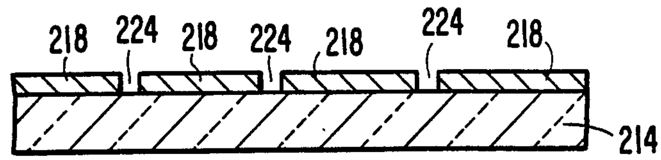
Figure 3C:
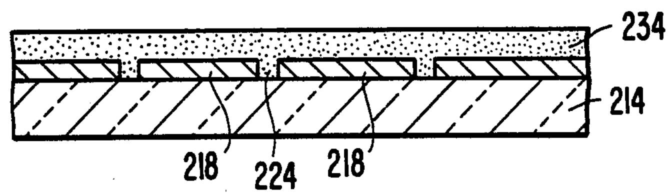
Figure 3D:
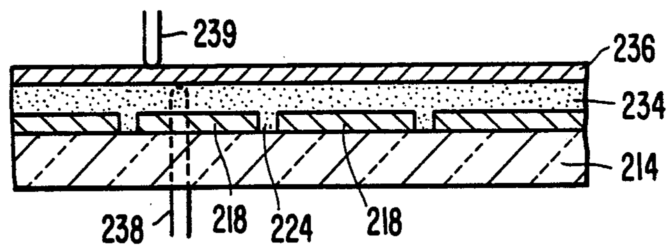
Figure 3E:
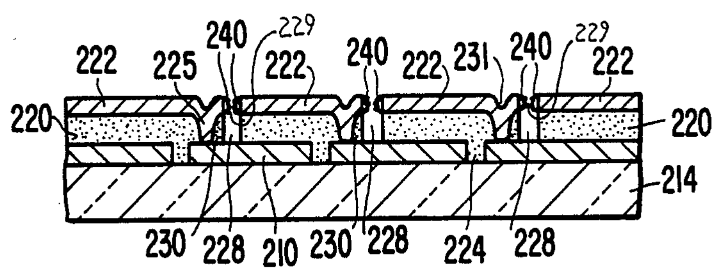
Figure 3F:
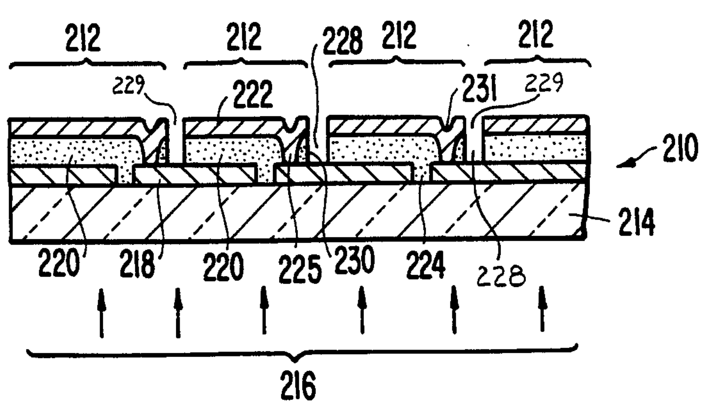

Reference now will be made in detail to the presently preferred embodiments of the invention, examples of which are illustrated in the accompanying drawings.

FIG. 2(*g*) is a schematic cross sectional view of a portion of a multi-cell thin-film photovoltaic module, designated generally by reference numeral 110, formed in accordance with one embodiment of the present invention. Photovoltaic module 110 is comprised of a plurality of series-connected photovoltaic cells 112 formed on a flat, transparent substrate 114. In operation, photovoltaic module 110 generates electricity in response to solar radiation 116 passing through substrate 114, which preferably is formed of glass. Each photovoltaic cell 112 includes a front electrode 118 of transparent conductive oxide, a photovoltaic element 120 made of a semiconductor material, such as, for example, hydrogenated amorphous silicon, and a back electrode 122 of a metal such as aluminum. Adjacent front electrodes 118 are separated by first grooves 124, which are filled with the semiconductor material of photovoltaic elements 120. Adjacent photovoltaic elements 120 are separated by second grooves 126 and also by third grooves 128. An inactive portion 130 of semiconductor material is positioned between second groove 126 and third groove 128. Portions 130 are "inactive" in the sense that they do not contribute to the conversion of solar radiation 116 into electricity. Second grooves 126 are filled with the metal of back electrodes 122 to provide a series connection between the front electrode of one cell and the back electrode of an adjacent cell. Gaps 129, located at the tops of third grooves 128, separate and electrically isolate adjacent back electrodes 122.

The method of this invention for forming photovoltaic module 110 now will be described with reference to FIGS. 2(*a*) through 2(*g*).

In accordance with the invention, a substantially continuous film 132 of transparent conductive oxide material, preferably fluorinated tin oxide, is fabricated on transparent substrate 114, as shown in FIG. 2(*a*). Conductive oxide film 132 can be fabricated in a manner well known in the art, for example, by chemical vapor deposition. The thickness of the transparent conductive oxide film will vary depending upon the desired application of the photovoltaic module.

Conductive oxide film 132 then is scribed with a laser to ablate the conductive oxide material along a first predetermined pattern of lines and form preferably parallel first grooves 124, which divide film 132 into a plurality of parallel front electrodes 118, as shown in FIG. 2(*b*). U.S. Pat. No. 4,292,092 discloses one suitable laser scribing technique, although certainly not the only suitable technique. Scribing can be performed either by moving the beam of the laser with respect to the substrate or by mounting the substrate on a X-Y table that is movable with respect to the beam of the laser. Scribing preferably is done from the front (through substrate 114) but can be done from the back (directly on conductive oxide film 132) as well. First grooves 124 preferably are about 25 micrometers in width.

In accordance with the invention, a photovoltaic region comprised of a substantially continuous thin film 134 of semiconductor material then is fabricated over front electrodes 118 and in first grooves 124, as shown in FIG. 2(*c*). The semiconductor material filling first grooves 124 provides electrical insulation between adjacent front electrodes 118. Preferably, the photovoltaic region is made of hydrogenated amorphous silicon in a conventional PIN structure (not shown) and is approximately 6000 Å in thickness, being comprised a a p-layer of 100 Å, an i-layer of 5200–5500 Å, and an n-layer of 500 Å. Deposition preferably is by glow discharge in silane, as described, for example, in U.S. Pat. No. 4,064,521.

In accordance with the first embodiment of the method of this invention, the semiconductor film 134 then is scribed with a laser to ablate the semiconductor material along a second predetermined pattern of lines and form second grooves 126, which divide semiconductor film 134 into a plurality of photovoltaic elements 120, as shown in FIG. 2(*d*). Front electrodes 118 are exposed at the bottoms of second grooves 126. Scribing may be performed with the same laser used to scribe transparent conductive oxide layer 132, except that power density is reduced to a level that will ablate the semiconductor material without affecting the conductive oxide of front electrodes 118. Consequently, the laser scribing of semiconductor film 134 also can be performed from either side of substrate 114. Second grooves 126 preferably are scribed adjacent and parallel to first grooves 124 and preferably are approximately 100 micrometers in width.

In accordance with the method of the first embodiment of this invention, a thin film 136 of metal, preferably aluminum, then is fabricated over photovoltaic elements 120 and in second grooves 126, as shown in FIG. 2(*e*). The metal filling second grooves 126 provides electrical connections between film 136 and the portions of front electrodes 118 exposed at the bottoms of second grooves 126. Metal film 136 is formed, for example, by sputtering or other well known techniques, the thickness of film 136 depending on the intended application of the module. As an example, for modules intended to generate sufficient power to charge 12-volt storage battery, metal film 136 typically is formed of aluminum and is about 7000 Å thick.

According to prior art laser scribing methods, the next step would be to scribe metal film 136 with a laser to ablate the metal along a pattern of lines and form a series of grooves dividing film 136 into a plurality of back electrodes. This method, as taught, for example, by U.S. Pat. No. 4,292,092, has proved to be impractical. Because of the high reflectivity of aluminum and other metals conventionally used to form the back electrodes, the laser used to scribe the back electrode film must be operated at a significantly higher power density than those used to scribe second grooves 126 in semiconductor film 134, often 10 to 20 times higher.

For example, if metal film 136 is formed of aluminum and is about 7000 Å thick, and if the aluminum is to be directly ablated by a frequency-doubled neodymium:YAG laser emitting light having a wavelength of about 0.53 micrometers and operated in a $TEM_{00}$ (spherical) mode, the laser typically would be focused to about 25 micrometers and operated at about 300 mW. When the same laser is used to ablate semiconductor film 134 and form second grooves 126, it preferably is defocused to 100 micrometers and is operated at about 360 mW. Although the laser would be operated at a slightly lower power level for direct ablation of aluminum, the number of photons per second per unit area, that is, the power density of the laser, also is a function of the spot size of the laser beam. For a given power level, power density varies inversely with the square of the radius of the spot. Thus, in the example described above, the laser power density required for direct ablation of the aluminum film is about 13 times the power density required to ablate the amorphous silicon film.

We have found that it is difficult to prevent a laser operating at the power density necessary for direct ablation of aluminum from damaging the underlying semiconductor material. Specifically, the photovoltaic cell becomes shorted due to molten metal flowing into the scribed groove and electrically connecting adjacent back electrodes, or due to molten metal diffusing into the underlying semiconductor material and producing a short across a photovoltaic element. In addition, where the underlying semiconductor material is comprised of amorphous silicon, we have discovered that the underlying amorphous silicon material recrystallizes. Moreover, in an amorphous silicon PIN structure dopants from the n-layer or p-layer often diffuse into the recrystallized amorphous silicon of the i-layer.

Therefore, in accordance with the first embodiment of the present invention, after fabrication of metal film 136, the photovoltaic regions 120 underlying metal film 136 are scribed with a laser operated at a power density sufficient to ablate the semiconductor material along a predetermined pattern of third lines parallel to and adjacent second grooves 126 but insufficient to ablate the conductive oxide of front electrodes 118 or the metal of film 136. More specifically, the laser must be operated at a power level that will ablate the semiconductor material and produce gases that structurally weaken and burst through the portions of the metal film positioned along the third lines to form substantially continuous gaps in the metal film along the third lines and separate the metal film into a plurality of back electrodes. As shown in FIG. 2(*e*), where the laser beams are shown schematically and designated by reference numerals 138, laser patterning of metal film 136 by ablation of the underlying semiconductor material is performed through substrate 114.

The method of this invention for patterning a metal film fabricated on a thin film of semiconductor material can be applied to thin film semiconductor devices having structures different from the specific embodiment shown in the drawings and discussed herein. As will be apparent to those of ordinary skill in the art, however, the method of this invention should not be applied to structures having films or layers of material disposed on the laser-incident side of the semiconductor film if such intervening films or layers will interfere with the propagation of the laser beam to the semiconductor film or if such intervening films or layers will inappropriately react with the laser in a manner that would, for example, damage the resulting semiconductor device.

In accordance with this invention, ablating the semiconductor material of photovoltaic regions 120 along the pattern of third lines forms third grooves 128 in the semiconductor material, as seen in FIG. 2(*f*). Third grooves 128 preferably are about 100 micrometers wide and are spaced apart from second grooves 126 by inactive portions 130 of semiconductor material. As described above, the ablation of the semiconductor material formerly in third grooves 128 produces gases, for example, silicon gas from the ablation of amorphous silicon, which structurally weaken and burst through the portions of metal film 136 overlying the ablated semiconductor material to form gaps 129 that separate film 136 into a plurality of back electrodes 122.

Gaps 129 preferably are substantially continuous as viewed along a line orthogonal to the plane of FIG. 2(*f*). The laser parameters required to produce continuous gaps 129 in metal film 136 will, of course, depend on a number of factors, such as the thickness and material of the metal film, the characteristic wavelength of the laser, the power density of the laser, the pulse rate of the laser, and the scribing feed rate. We have found that, to pattern a film of aluminum having a thickness of about 3000–7000 Å by ablation of an underlying amorphous silicon film approximately 6000 Å in thickness with a frequency-doubled neodymium:YAG laser emitting light having a wavelength of about 0.53 micrometers, when the pulse rate of the laser is about 5 kHz, and the feed rate is about 13 cm/sec, the laser should be focused to about 100 micrometers in a $TEM_{00}$ (spherical) mode and operated at about 320–370 mW. Under the above conditions, when the laser is operated at less than about 320 mW, portions of metal film 136 remain as bridges across third grooves 128 and produce shorts between adjacent cells. When the laser is operated above about 370 mW, continuous gaps 129 are produced, but the performance of the resulting module, as measured by the fill factor, is degraded. Although the precise cause of degraded performance presently is unknown, we believe that the higher laser power levels cause melting of portions of the amorphous silicon photovoltaic elements that remain after third grooves 128 are ablated. In addition, the increased power densities cause the laser to cut into front electrodes 118, which increases series resistance and, if the power density is sufficiently high, renders the module inoperable by cutting off the series connections between adjacent cells.

Because the overlying metal film is not melted by the relatively low-powered laser used ablate the semiconductor material in third grooves 128, shorts are not created by molten metal flowing into third grooves 128 or diffusing into the underlying photovoltaic regions. Furthermore, the ablated semiconductor material is thermally cooled by the overlying metal and by the sudden expansion of the vapors produced during ablation. This local cooling helps prevent recrystallization of amorphous silicon and the melting of the overlying metal film by the hot semiconductor vapors.

Even when a continuous gap 129 is formed by ablation of the underlying semiconductor material, metal flakes and other debris, designated by reference numerals 140 in FIG. 2(*f*), often remain along the edges of gap 129. Therefore, in accordance with the method of this invention, this debris is removed by subjecting module 110 to ultrasonic vibration in a fluid bath, preferably in water. After vibration, the resulting photovoltaic module has clean, unshorted gaps 129 separating adjacent back electrodes 122. Debris 140 also can be removed by blowing it away with a jet of nitrogen or other gas passed along gaps 129.

FIG. 3(*f*) is a schematic cross sectional view of a multicell, thin-film photovoltaic module, designated generally by reference numeral 210, formed in accordance with a second embodiment of this invention. Module 210 is comprised of a plurality of series-connected photovoltaic cells 212 formed on a flat, transparent substrate 214 and subjected to solar radiation 216 passing through substrate 214. Each photovoltaic cell 212 includes a front electrode 218 of transparent conductive oxide, a photovoltaic element 220 made of a semiconductor material, such as, for example, hydrogenated amorphous silicon, and a back electrode 222 of a metal such as aluminum. Adjacent front electrodes 218 are separated by first grooves 224, which are filled with the semiconductor material of photovoltaic elements 220. Adjacent photovoltaic elements 220 are separated by interconnect portions 225 of back electrodes 222 and by second grooves 228. Positioned between each interconnect portion 225 and its corresponding second groove 228 is an inactive portion 230 of semiconductor material. Interconnect portions 225 are formed by local melting of the back electrode metal through photovoltaic elements 220 and provide a series connection between the front electrode of one cell and the back electrode of an adjacent cell. The top surfaces of back electrodes 222 typically include depressions 231 overlying interconnect portions 225. Gaps 229, located at the tops of second grooves 228, separate and electrically isolate adjacent back electrodes 222.

A method of forming the photovoltaic module shown in FIG. 3(*f*) in accordance with the second embodiment of the present invention now will be described with reference to FIGS. 3(*a*) through 3(*f*).

Through the step of fabricating the thin film of semiconductor material, the method of the second embodiment is essentially the same as the method of the first embodiment. With reference to FIGS. 3(*a*) through 3(*c*), the method of the second embodiment of this invention includes fabricating a continuous thin film 232 of conductive transparent oxide, preferably fluorinated tin oxide, on transparent substrate 214, laser scribing first grooves 224 to separate transparent conductive oxide film 232 into a plurality of front electrodes 218, and fabricating a continuous film of photovoltaic semiconductor material 234, preferably hydrogenated amorphous silicon in a PIN structure, on top of front electrodes 218 and in first grooves 224.

In accordance with the second embodiment of the method of this invention, the next step includes fabricating a thin film 236 of metal, preferably aluminum, on top of semiconductor film 234. Metal film 236 is fabricated in the same manner as film 136 in FIG. 2(*d*).

In accordance with the method of the second embodiment of this invention, the next step comprises laser patterning with two laser beams, designated by reference numerals 238 and 239 in FIG. 3(*d*). The two laser beams preferably are operated simultaneously. Laser beam 238 is operated at a power density sufficient to ablate the semiconductor material of film 234 to form second grooves 228 in the semiconductor film 234. Ablation of the semiconductor film produces gases that burst through and structurally weaken the portions of metal film 236 overlying the ablated semiconductor material to produce gaps 229 in film 236, in the same manner as described with reference to laser beam 138 in FIG. 2(*e*). As in the first embodiment of the method of this invention, the laser scribing of second grooves often leaves metal debris 240 at the edges of gaps 229. Metal debris 240 can be removed subsequently in an ultrasonic bath.

In accordance with the method of the second embodiment of this invention, a pattern of lines are scribed in metal film 236 with second laser beam 239 operated at a power density sufficient to melt the metal f film 236 through the underlying semiconductor film 234, thus producing interconnect portions 225 and depressions 231. Interconnect portions 225 form electrical connections between the back electrodes 222 formed from metal film 236 and the front electrodes 218.

When metal film 236 is formed of aluminum and has a thickness of approximately 7000 Å, and when the melting scribe represented by second laser beam 239 is performed with a frequency-doubled neodymium:YAG laser emitting light having a wavelength of about 0.53 micrometers, the laser preferably is operated at a power of about 400 mW in a $TEM_{00}$ (spherical) mode focused to about 25 micrometers. The pulse rate of the laser preferably is approximately 5 kHz and the feed rate, the rate at which the laser beam is moved across film 236, preferably is 10–18 cm/sec, more preferably about 16.5 cm/sec.

Under the above scribing conditions, a single pass of the laser beam normally is sufficient to produce a continuous metal-to-metal interconnection between front electrode 218 and back electrode 222 along the length of a cell 212. Under different scribing conditions, for example with reduced laser power, lower pulse rate, or higher feed rate, an intermittent connection or a connection through an alloy of semiconductor material and metal might be produced after a single scribe, with a resultant increase in overall series resistance in the module and a poor fill factor. This problem can be corrected by performing multiple melting scribes for each cell.

The second embodiment of the method of this invention provides additional advantages in production efficiency over the first embodiment of this invention. By fabricating metal film 236 on top of semiconductor film 234 without an intervening step of scribing grooves in semiconductor film 234, the time spent in moving the module subassembly from the semiconductor film deposition station to the laser scribing station and then to the metal film deposition station is eliminated. In accordance with the second embodiment of the method of this invention, the substrate can be moved directly from the semiconductor deposition chamber to the metal film deposition chamber and then to the laser scribing station, where portions 225 of metal film 236 can be melted through the semiconductor film 234 and the grooves 228 can be formed. Thus, a separate station normally dedicated to scribing the semiconductor film (grooves 126 in the first embodiment of the invention) can be eliminated and production throughput can be increased. Furthermore, by allowing deposition of metal film 236 to follow immediately after deposition of semiconductor film 234, impurity absorption (for example, absorption of $H_2O$ or $O_2$) by the semiconductor film can be minimized.

Both embodiments of the present invention have substantial production efficiency advantages over prior art methods that pattern the back electrodes by acid etching with silkscreened resist patterns. An additional advantage provided by an all-laser patterning method relative to a silkscreening method is an increase in the active area of the photovoltaic module and thus an increase in the total power output for a module having a given substrate area. The "active area" of a photovoltaic module is the area which photovoltaic conversion of light into electricity takes place.

Figure 4A:
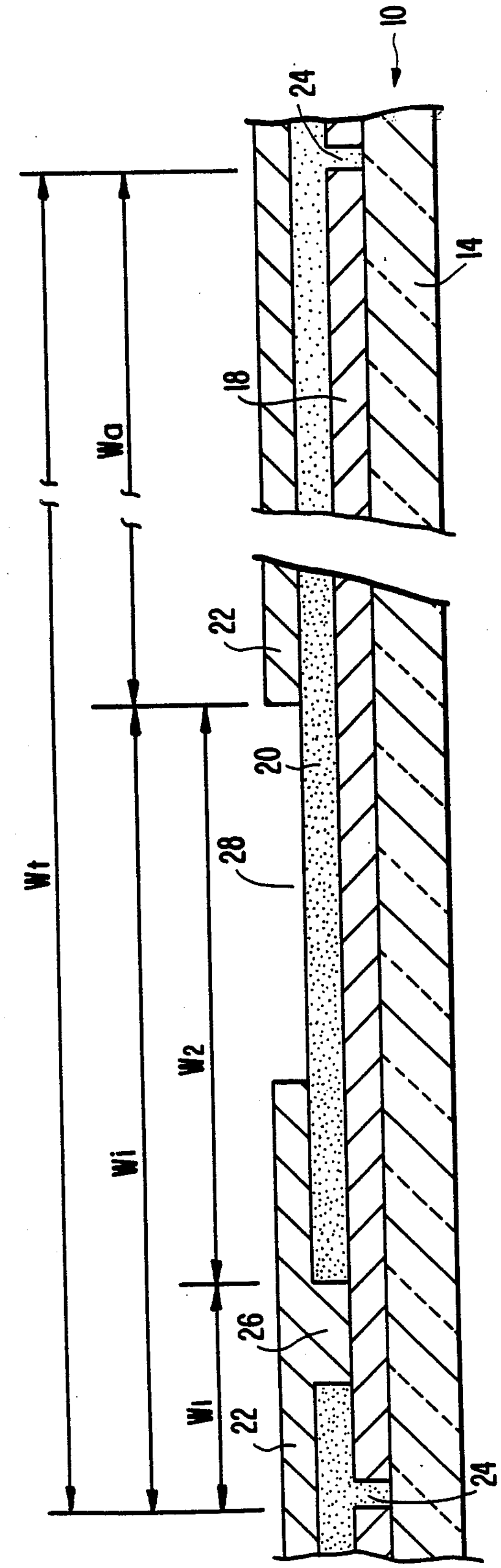
FIGS. 4(*a*) and 4(*b*) are schematic cross sectional views of photovoltaic cells fabricated according to a prior art method and one embodiment of the method of this invention, respectively.
Figure 4B:
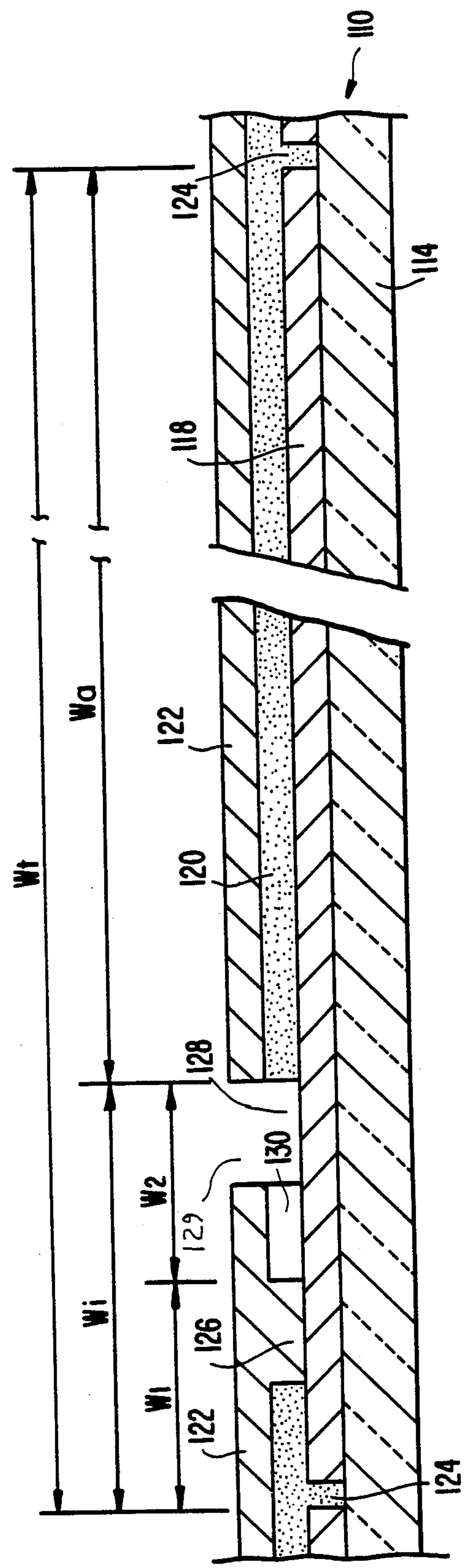

FIGS. 4(*a*) and 4(*b*) show why the active area of photovoltaic module patterned in accordance with the present invention is greater than that of a conventional module having back electrodes patterned by silkscreening. FIGS. 4(*a*) and 4(*b*) are, respectively, schematic cross-sectioned views of a single cell of photovoltaic modules 10 and 110 of FIGS. 1 and 2(*g*). Dimension $W_t$ represents the total width of each cell and comprises active width $W_a$ and inactive width $W_i$. The active area is the product of the length of the cell and $W_a$ and includes the portion of photovoltaic element 20, 120 that is sandwiched between its corresponding front electrode 18, 118 and back electrode 22, 122.

The portion of inactive width $W_i$ designated as $W_l$ is the same for both modules 10 and 110 (as well as for module 210 of FIG. 2(*f*), in which interconnect portion 225 has substantially the same position as second grooves 26, 126) and typically measures approximately 225 micrometers. Typically, first groove 24, 124 is about 25 micrometers wide, second groove 26, 126 is about 100 micrometers wide, and the spacing between the grooves is about 100 micrometers.

By laser patterning groove 128 in accordance with the present invention, however, a module having a much smaller dimension $W_2$ (and consequently a larger active area) can be obtained than by practice of conventional acid etching of the back electrodes with silkscreened resist patterns. For a module fabricated in accordance with the first embodiment of the present invention, third groove 128 separating adjacent back electrodes 122 typically is spaced from second groove 126 by about 100 micrometers and is about 100 micrometers in width, so that dimension $W_2$ is about 200 micrometers and $W_i$ is about 425 micrometers as seen in FIG. 4(*b*). Dimension $W_i$ for a cell of module 210 fabricated in accordance with the second embodiment of this invention (see FIG. 3(*f*)) is also about 425 micrometers. In contrast, acid-etched third grooves 28 of conventional module 10 typically are about 380 micrometers wide and are separated from second groove 26 by about 200 micrometers to provide a reasonable margin for error in placement of the resist patterns. Thus, $W_i$ for a conventional module typically is about 805 micrometers, almost twice that of a module fabricated in accordance with the present invention. The laser scribing steps preferably are computer controlled so that the grooves can be scribed close together with high accuracy.

The advantages of present invention are illustrated further by the following examples comparing the performance of photovoltaic modules having back electrodes fabricated according to the first embodiment of the present invention with photovoltaic modules having back electrodes patterned by acid etching.

EXAMPLE I

Test specimens of photovoltaic modules designed for charging 12-volt electrical storage batteries were produced in several production lots. Each lot consisted of two sets of test specimens fabricated under the same conditions except for the method of patterning the back electrodes. For each lot, the back electrodes of one set of specimens were patterned in accordance with the prior art method of acid etching with silkscreened etch resists. Each module consisted of 30 cells formed on a rectangular glass substrate measuring approximately 30 cm by 33 cm. All laser scribing was performed with a frequency-doubled neodymium:YAG laser emitting light having a wavelength of about 0.53 micrometers and focused in a $TEM_{00}$ (spherical) mode with a pulse rate of about 5 kHz.

For both sets of test specimens, a transparent conductive oxide layer of fluorinated tin oxide was deposited by chemical vapor deposition on a glass substrate, as shown in FIG. 2(*a*), to a thickness of approximately 5000 Å. The tin oxide film was textured, with a sheet resistivity of 20–40 Ω/□. Each tin oxide film then was scribed with the laser from the front side to ablate the tin oxide material along a pattern of lines and form parallel first grooves approximately 25 micrometers wide dividing the tin oxide film into 30 parallel front electrodes, as shown in FIG. 2(*b*). The laser was focused to about 25 micrometers and was operated at about 400 mW during the tin oxide scribe. The feed rate was about 5 cm/sec.

For each test specimen, a thin film of hydrogenated amorphous silicon having a PIN structure then was deposited by glow discharge of silane on the tin oxide electrodes and in the first grooves, as shown in FIG. 2(*c*). The amorphous silicon film comprised a p-layer approximately 100 Å thick, an i-layer approximately 5300 Å thick, and an n-layer approximately 500 Å thick. The amorphous silicon film then was scribed with the laser from the front side to ablate the amorphous silicon along a second predetermined pattern of lines to form second grooves separating the amorphous silicon film into 30 parallel photovoltaic elements, as shown in FIG. 2(*d*). The second grooves were approximately 100 micrometers wide and were spaced from the first grooves by about 100 micrometers. The laser was focused to about 100 micrometers with a feed rate of approximately 9 cm/sec during scribing of the second grooves.

A thin film of aluminum approximately 7000 Å thick then was fabricated by sputtering on top of the photovoltaic elements and in the second grooves, as shown in FIG. 2(*e*), and the modules were thermally cured at about 150° C. for approximately one hour.

For each production lot, the aluminum film of one set of modules was patterned by conventional silkscreening to form third grooves approximately 380 micrometers wide separating adjacent back electrodes. The acid-etched third grooves were separated from the second grooves by about 200 micrometers.

For the other set in each lot the amorphous silicon underlying the metal film was scribed with a laser from the front side along a predetermined pattern of third lines. The laser was focused to about 100 micrometers and was operated at about 360 mW with a feed rate of about 13 cm/sec. The laser ablated the amorphous silicon material, which in turn produced gases that burst through and structurally weakened the overlying portions of the aluminum film, thus forming third grooves separating the aluminum film into 30 parallel back electrodes. The laser-patterned third grooves were about 100 micrometers wide and were separated from the second grooves by about 100 micrometers. The laser-scribed modules then were subjected to an ultrasonic bath in tap water for approximately 1 minute to remove any metal debris bridging the third grooves.

Both sets of modules in each lot then were electrically cured by subjecting the individual cells to reverse bias voltage and were heat treated for approximately 1 hour at about 150° C. Both sets of modules in each lot then were tested for active area efficiency under standard AMI illumination conditions. "Active area efficiency" is a measure of the power output of the module as a percentage of the solar power incident on the active area of the module.

The results of the efficiency tests based on the active area of the modules are set forth in Table I. For each lot, the average efficiency of the modules patterned by acid etching with silkscreened etch resists and the modules patterned by laser ablation of the underlying semiconductor material are given. For all but one lot, the efficiency of the laser-patterned modules exceeds the efficiency of the silkscreen-patterned modules. In the one instance where the laser pattern modules had a lower efficiency (Lot No. H-150) the efficiency was virtually identical.

TABLE I

| Lot No. | Average Efficiency of Lot By Silkscreen Patterning | Average Efficiency of Lot By Laser Patterning |
|---|---|---|
| D-1101 | 5.38 | 5.44 |
| D-1113 | 5.58 | 6.17 |
| D-1123 | 6.22 | 6.79 |
| H-124 | 5.92 | 6.12 |
| H-148 | 6.07 | 6.90 |
| H-149 | 4.99 | 5.57 |
| H-150 | 5.82 | 5.81 |
| T 129 | 4.50 | 5.31 |
| T-148 | 5.67 | 5.76 |
| T-150 | 4.45 | 5.84 |

EXAMPLE II

Four test modules having comparable active area efficiency, two modules patterned by laser scribing and two modules patterned by silkscreening, were selected for testing total area efficiency. "Total area efficiency" is a measure of the power output of the module as a percentage of the solar power incident on the entire substrate. The results of this test are set forth in Table II.

TABLE II

| Module No. | Patterning Method | Active Area Efficiency | Total Area Efficiency |
|---|---|---|---|
| A | Silkscreen | 8.69 | 7.39 |
| B | Silkscreen | 8.54 | 7.26 |
| C | Laser | 8.56 | 7.74 |
| D | Laser | 8.75 | 7.91 |

As is apparent from Table II, total area efficiency is significantly higher for modules patterned by a laser in accordance with the method of this invention compared to modules patterned by conventional silkscreening methods, even when active area efficiency is approximately the same. The reason for the increase in total area efficiency, of course, is that laser patterning of the back electrodes produces narrower grooves separating adjacent back electrodes so that a greater proportion of the substrate area can be utilized for photovoltaic conversion.

It will be apparent to those skilled in the art that modifications and variations can be made in the method of this invention without departing from the scope of the invention. For example, the method can be applied to patterning other than back electrodes and can be applied to patterning conductive elements on thin-film semiconductor devices other than photovoltaic devices, such as thin-film transistors. Moreover, although the method if this invention has been described with reference to patterning an aluminum film overlying a thin film of amorphous silicon, it can be applied to thin film semiconductor devices fabricated with other materials. For example, thin films of amorphous silicon alloys such as amorphous silicon carbide or nitride, thin films of amorphous silicon containing microcrystalline structures, and thin films of polycrystalline silicon can be ablated to pattern an overlying metal film in accordance with the invention. Films comprised of metals other than aluminum, for example, titanium films, can be patterned and interconnected by the method of this invention. Laser scribing can be performed at wavelengths other than those described in the present application. The invention in its broader aspects is, therefore, not limited to the specific details and illustrated examples shown and described. Accordingly, it is intended that the present invention cover such modifications and variations, provided that they fall within the scope of the appended claims and their equivalents.

What is claimed is:

1. A method of forming a multi-cell thin-film semiconductor device with laser-patterned back electrodes, comprising the steps of:

a. fabricating a plurality of spaced-apart front electrodes on a substrate;

b. fabricating a thin film of semiconductor material on said front electrodes;

c. fabricating a thin film of metal on said semiconductor film;

d. scribing said metal film along a pattern of first lines with a laser operated at a first power density sufficient to melt said metal through said underlying semiconductor film and form electrical connections between said metal film and said front electrodes along said first lines; and e. scribing said semiconductor film along a pattern of second lines with a laser operated at a second power density sufficient to ablate said semiconductor material along said second lines, said second lines being substantially parallel to and adjacent said first lines, the ablation of said semiconductor material producing gases that structurally weaken and burst through said metal film overlying said semiconductor material along said second lines to form gaps separating said metal film into a plurality of back electrodes.

2. The method of claim 1, further comprising the step of applying ultrasonic vibration to said semiconductor device after said second line scribing step.

3. The method of claim 1, wherein said first and second line scribing steps are performed substantially simultaneously.

4. The method of claim 1, wherein:

said semiconductor film comprises amorphous silicon and is about 6000 Å thick;

said metal film comprises aluminum and is about 7000 Å thick; and said scribing steps are performed with a frequency-doubled neodymium:YAG laser emitting light having a wavelength of about 0.53 micrometers.

5. The method of claim 4, wherein said laser is focused to about 25 micrometers and is operated at about 400 mW during said first line scribing step.

6. The method of claim 5, wherein said laser is operated at a pulse rate of about 5 kHz and moves relative to said substrate at a feed rate of about 10–18 cm/sec during said first line scribing step.

7. The method of claim 5, wherein said laser is operated at a pulse rate of about 5 kHz and moves relative to said substrate at a feed rate of about 16.5 cm/sec during said first line scribing step.

8. The method of claim 4, wherein said laser is focused to about 100 micrometers and is operated at about 320–370 mW during said second line scribing step.

9. The method of claim 8, wherein said laser is operated at a pulse rate of about 5 kHz and moves relative to said substrate at a feed rate of about 13 cm/sec during said second line scribing step.

10. A multi-cell thin-film semiconductor device fabricated by a process comprising the steps of:

a. fabricating a plurality of spaced-apart front electrodes on a substrate;

b. fabricating a thin film of semiconductor material on said front electrodes;

c. fabricating a thin film of metal on said semiconductor film;

d. scribing said metal film along a pattern of first lines with a laser operated at a first power density sufficient to melt said metal through said underlying semiconductor film and form electrical connections between said metal film and said front electrodes along said first lines; and e. scribing said semiconductor film along a pattern of second lines with a laser operated at a second power density sufficient to ablate said semiconductor material along said second lines, said second lines being substantially parallel to and adjacent said first lines, the ablation of said semiconductor material producing gases that structurally weaken and burst through said metal film overlying said semiconductor material along said second lines to form gaps separating said metal film into a plurality of back electrodes.

* * * * *